(12) United States Patent
Tsai et al.

(10) Patent No.: US 10,276,389 B1
(45) Date of Patent: Apr. 30, 2019

(54) SEMICONDUCTOR DEVICE AND METHOD FOR FABRICATING THE SAME

(71) Applicants: UNITED MICROELECTRONICS CORP., Hsin-Chu (TW); Fujian Jinhua Integrated Circuit Co., Ltd., Quanzhou, Fujian Province (CN)

(72) Inventors: Chih-Chieh Tsai, Kaohsiung (TW); Yi-Wei Chen, Taichung (TW); Pin-Hong Chen, Tainan (TW); Chih-Chien Liu, Taipei (TW); Tzu-Chieh Chen, Pingtung County (TW); Chun-Chieh Chiu, Keelung (TW); Tsun-Min Cheng, Changhua County (TW); Kai-Jiun Chang, Taoyuan (TW); Chia-Chen Wu, Nantou County (TW); Yi-An Huang, New Taipei (TW)

(73) Assignees: UNITED MICROELECTRONICS CORP., Hsin-Chu (TW); Fujian Jinhua Integrated Circuit Co., Ltd., Quanzhou, Fujian Province (CN)

( * ) Notice: Subject to any disclaimer, the term of this patent is extended or adjusted under 35 U.S.C. 154(b) by 0 days.

(21) Appl. No.: 15/987,887

(22) Filed: May 23, 2018

(30) Foreign Application Priority Data

Apr. 17, 2018 (CN) .......................... 2018 1 0341859

(51) Int. Cl.
| | | |
|---|---|---|
| *H01L 21/8238* | (2006.01) | |
| *H01L 21/336* | (2006.01) | |
| *H01L 29/78* | (2006.01) | |
| *H01L 29/76* | (2006.01) | |
| *H01L 21/28* | (2006.01) | |
| *H01L 21/768* | (2006.01) | |

(Continued)

(52) U.S. Cl.
CPC .. *H01L 21/28052* (2013.01); *H01L 21/76889* (2013.01); *H01L 27/10805* (2013.01); *H01L 27/10882* (2013.01); *H01L 29/4941* (2013.01)

(58) Field of Classification Search
CPC ......... H01L 21/28052; H01L 21/76889; H01L 27/10882; H01L 27/10805
USPC ....... 257/757, 763, 751, 326, 365, 368, 413, 257/E21.169, E21.198, E21.2, E21.294, 257/E21.636, E21.637, E27.062, E27.103, 257/E29.129, E29.146, E29.157, E29.162; 365/185.33; 438/197, 463, 586, 592, 594
See application file for complete search history.

(56) References Cited

U.S. PATENT DOCUMENTS

| | | | | |
|---|---|---|---|---|
| 5,796,166 A | * | 8/1998 | Agnello | ............ H01L 21/28061 257/369 |
| 6,306,743 B1 | * | 10/2001 | Lee | ................... H01L 21/28061 257/413 |
| 7,153,773 B2 | | 12/2006 | Otsuki et al. | |

(Continued)

*Primary Examiner* — Dao H Nguyen
(74) *Attorney, Agent, or Firm* — Winston Hsu

(57) ABSTRACT

A method for fabricating semiconductor device includes the steps of: forming a silicon layer on a substrate; forming a first metal silicon nitride layer on the silicon layer; performing an oxygen treatment process to form an oxide layer on the first metal silicon nitride layer; forming a second metal silicon nitride layer on the oxide layer; forming a conductive layer on the second metal silicon nitride layer; and patterning the conductive layer, the second metal silicon nitride layer, the oxide layer, the first metal silicon nitride layer, and the silicon layer to form a gate structure.

19 Claims, 4 Drawing Sheets

(51) Int. Cl.
*H01L 29/49* (2006.01)
*H01L 27/108* (2006.01)

(56) References Cited

U.S. PATENT DOCUMENTS

| | | | |
|---|---|---|---|
| 8,558,299 B2 | 10/2013 | Cao et al. | |
| 9,583,349 B2 | 2/2017 | Gandikota et al. | |
| 2003/0043637 A1* | 3/2003 | Forbes | H01L 27/115 365/185.33 |
| 2004/0207030 A1* | 10/2004 | McTeer | H01L 21/28061 257/412 |
| 2006/0223252 A1* | 10/2006 | Park | H01L 21/823828 438/197 |
| 2008/0157205 A1* | 7/2008 | Sung | H01L 21/28061 257/365 |

* cited by examiner

US 10,276,389 B1

SEMICONDUCTOR DEVICE AND METHOD FOR FABRICATING THE SAME

BACKGROUND OF THE INVENTION

1. Field of the Invention

The invention relates to a method for fabricating semiconductor device, and more particularly to a method for fabricating bit line structure of a dynamic random access memory (DRAM) device.

2. Description of the Prior Art

As electronic products develop toward the direction of miniaturization, the design of dynamic random access memory (DRAM) units also moves toward the direction of higher integration and higher density. Since the nature of a DRAM unit with buried gate structures has the advantage of possessing longer carrier channel length within a semiconductor substrate thereby reducing capacitor leakage, it has been gradually used to replace conventional DRAM unit with planar gate structures.

Typically, a DRAM unit with buried gate structure includes a transistor device and a charge storage element to receive electrical signals from bit lines and word lines. Nevertheless, current DRAM units with buried gate structures still pose numerous problems due to limited fabrication capability. Hence, how to effectively improve the performance and reliability of current DRAM device has become an important task in this field.

SUMMARY OF THE INVENTION

According to an embodiment of the present invention, a method for fabricating semiconductor device includes the steps of: forming a silicon layer on a substrate; forming a first metal silicon nitride layer on the silicon layer; performing an oxygen treatment process to form an oxide layer on the first metal silicon nitride layer; forming a second metal silicon nitride layer on the oxide layer; forming a conductive layer on the second metal silicon nitride layer; and patterning the conductive layer, the second metal silicon nitride layer, the oxide layer, the first metal silicon nitride layer, and the silicon layer to form a gate structure.

According to another aspect of the present invention, a semiconductor device includes a gate structure on a substrate, in which the gate structure further includes: a silicon layer on the substrate; a first metal silicon nitride layer on the silicon layer; an oxide layer on the first metal silicon nitride layer; a second metal silicon nitride layer on the oxide layer; and a conductive layer on the second metal silicon nitride layer.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
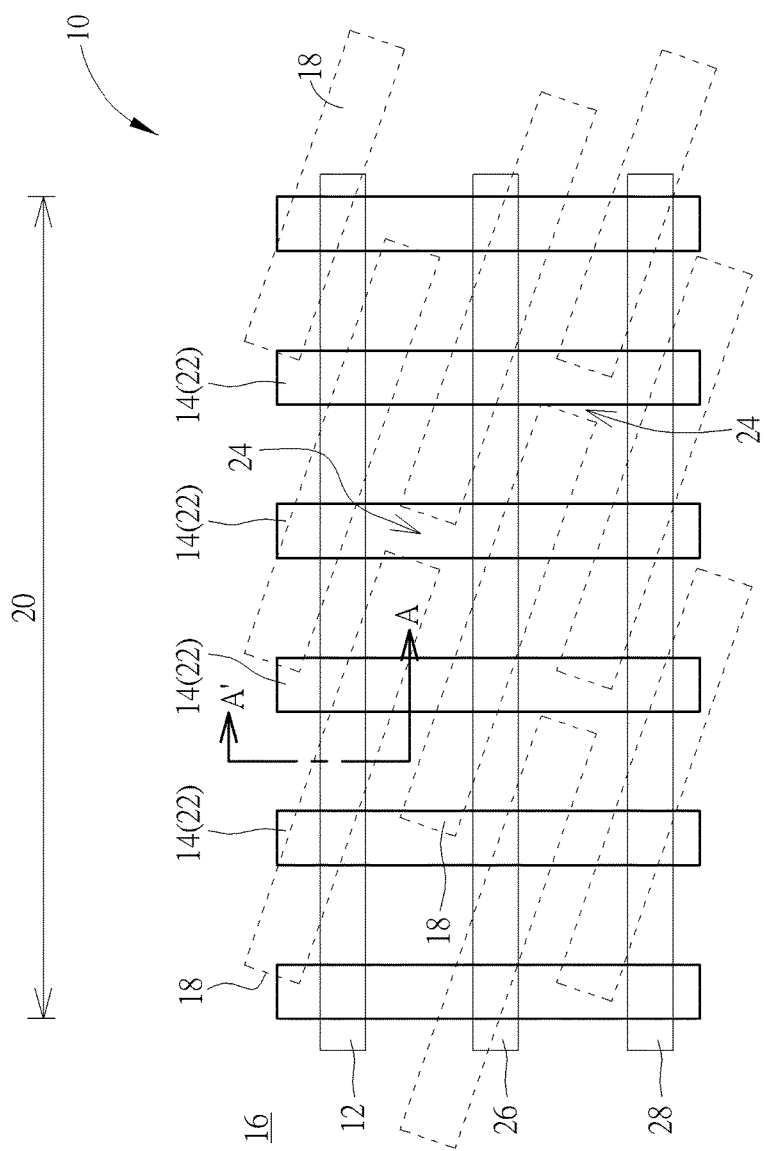
FIG. 1 illustrates a top-view diagram of a DRAM device according to an embodiment of the present invention.

Referring to FIGS. 1-6, FIGS. 1-6 illustrate a method for fabricating a DRAM device according to an embodiment of the present invention, in which FIG. 1 illustrates a top-view diagram for fabricating a DRAM device and FIGS. 2-6 illustrate cross-sectional views of a method for fabricating bit line of the DRAM device along the sectional line AA' of FIG. 1. Preferably, the present embodiment pertains to fabricate a memory device, and more particularly a DRAM device 10, in which the DRAM device 10 includes at least a transistor device (not shown) and at least a capacitor structure (not shown) that will be serving as a smallest constituent unit within the DRAM array and also used to receive electrical signals from bit lines or bit line structures 12, 26, 28 and word lines 14.

As shown in FIG. 1, the DRAM device 10 includes a substrate 16 such as a semiconductor substrate or wafer made of silicon, a shallow trench isolation (STI) 24 formed in the substrate 16, and a plurality of active areas (AA) 18 defined on the substrate 16. A memory region 20 and a periphery region (not shown) are also defined on the substrate 16, in which multiple word lines 14 and multiple bit line structures 12, 26, 28 are preferably formed on the memory region 20 while other active devices (not shown) could be formed on the periphery region. For simplicity purpose, only devices or elements on the memory region 20 are shown in FIG. 1 while elements on the periphery region are omitted.

In this embodiment, the active regions 18 are disposed parallel to each other and extending along a first direction, the word lines 14 or multiple gates 22 are disposed within the substrate 16 and passing through the active regions 18 and STI 24. Specifically, the gates 22 are disposed extending along a second direction such as Y-direction, in which the second direction crosses the first direction at an angle less than 90 degrees.

The bit line structures 12, 26, 28 are disposed on the substrate 16 parallel to each other and extending along a third direction such as X-direction while crossing the active regions 18 and STI 24, in which the third direction is different from the first direction and orthogonal to the second direction. In other words, the first direction, second direction, and third direction are all different from each other while the first direction is not orthogonal to both the second direction and the third direction. Preferably, contact plugs such as bit line contacts (BLC) (not shown) are formed in the active regions 18 adjacent to two sides of the word lines 14 to electrically connect to source/drain region (not shown) of each transistor element and storage node contacts (not shown) are formed to electrically connect to a capacitor.

Figure 2:
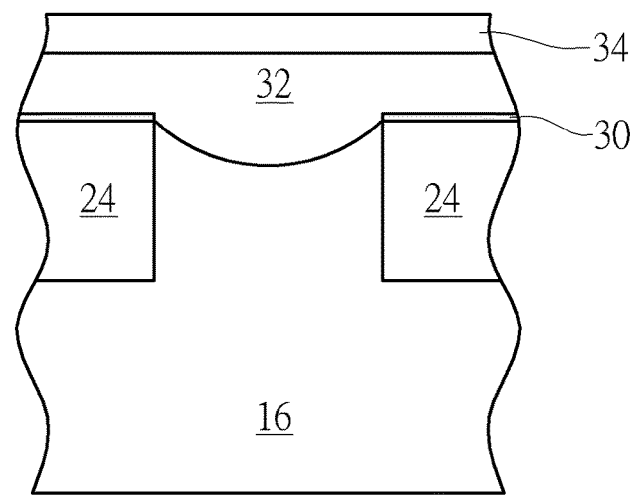
FIGS. 2-6 illustrate cross-sectional views of a method for fabricating bit line of the DRAM device along the sectional line AA' of FIG. 1.

The fabrication process conducted after the formation of word lines 14 (or also referred to as buried word lines) and STI 24 is explained below. First as shown in FIG. 2, a STI 24 is formed in the substrate 16 to define the active regions 18 and word lines (not shown) are formed in part of the STI 24 and the substrate 16, and an insulating layer or more specifically a gate insulating layer 30 is formed on the surface of the STI 24 and the substrate 16. Preferably, the gate insulating layer 30 is serving as a gate insulating layer on the periphery region while serving as a mask layer on the memory region 20 in this embodiment. Next, a photo-etching process is conducted by using patterned mask (not shown) as mask to remove part of the gate insulating layer 30 between the STI 24 and part of the substrate 16 to form a recess (not shown) and then form a semiconductor layer or more specifically a silicon layer 32 in the recess and on the surface of the gate insulating layer 30, in which part of the silicon layer 32 directly contacting the substrate 16 preferably serves as a bit line contact (BLC) after a patterning process is conducted afterwards. Next, a selective pre-clean process could be conducted to remove impurities on the surface of the silicon layer 32, and then an atomic layer deposition (ALD) process is conducted to form a first metal silicon nitride layer 34 on the surface of the silicon layer 32.

In this embodiment, the gate insulating layer 30 is preferably a single-layered structure made of silicon oxide. Nevertheless, according to an embodiment of the present invention, the gate insulating layer 30 could also be a multi-layered structure made of a silicon oxide layer, a silicon nitride, layer, and another silicon oxide layer, which is also within the scope of the present invention. The silicon layer 32 disposed on the gate insulating layer 30 preferably includes amorphous silicon, but not limited thereto.

Figure 3:
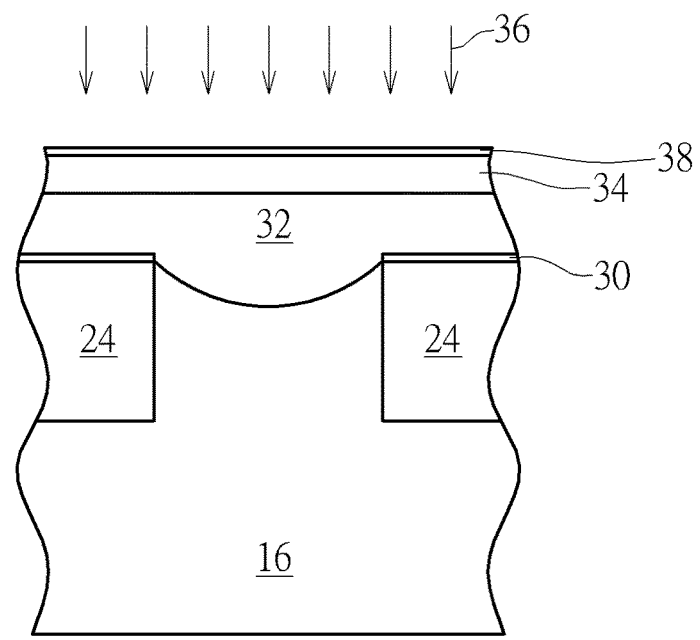

Next, as shown in FIG. 3, an oxygen treatment process 36 is conducted to form an oxide layer 38 such as a silicon oxide layer on the surface of the first metal silicon nitride layer 34. Preferably, the oxygen treatment process 36 could be accomplished by an oxygen plasma surface treatment process or exposing the first metal silicon nitride layer 34 in the air to form an oxide layer 38 on the surface of the first metal silicon nitride layer 34. In this embodiment, the thickness of the oxide layer 38 is preferably between 4.5 Angstroms to 5.5 Angstroms or most preferably at around 5 Angstroms.

Figure 4:
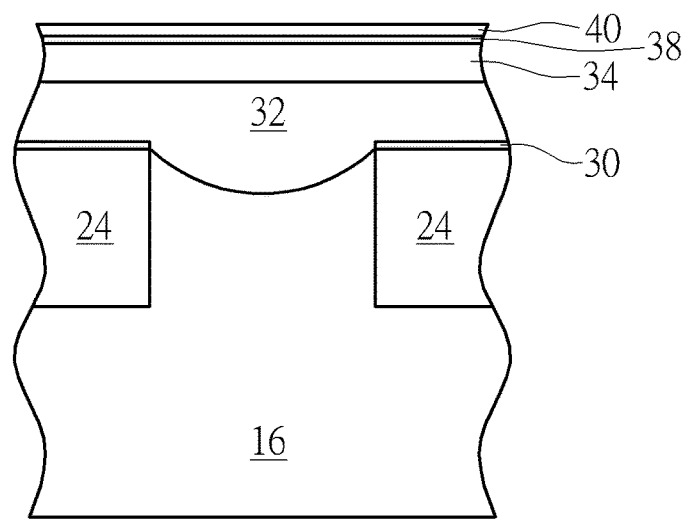

Next, as shown in FIG. 4, a second metal silicon nitride layer 40 is formed on the surface of the oxide layer 38. In this embodiment, the first metal silicon nitride layer 34 and the second metal silicon nitride layer 40 are preferably made of same material such as titanium silicon nitride (TiSiN). Nevertheless, according to an embodiment of the present invention, the first metal silicon nitride layer 34 and the second metal silicon nitride layer 40 could also be made of different materials while the metal element from each of the first metal silicon nitride layer 34 and the second metal silicon nitride layer 40 could be selected from the group consisting of titanium (Ti), tungsten (W), nickel (Ni), and cobalt (Co), which is also within the scope of the present invention. Moreover, the thickness of the first metal silicon nitride layer 34 in this embodiment is preferably greater than the thickness of the second metal silicon nitride layer 40, in which the thickness of the first metal silicon nitride layer 34 is preferably less than 15 Angstroms and greater than 0, the thickness of the second metal silicon nitride layer 40 is preferably less than 5 Angstroms and greater than 0, and a total or combined thickness of the first metal silicon nitride layer 34 and the second metal silicon nitride layer 40 is preferably less than 20 Angstroms.

Figure 5:
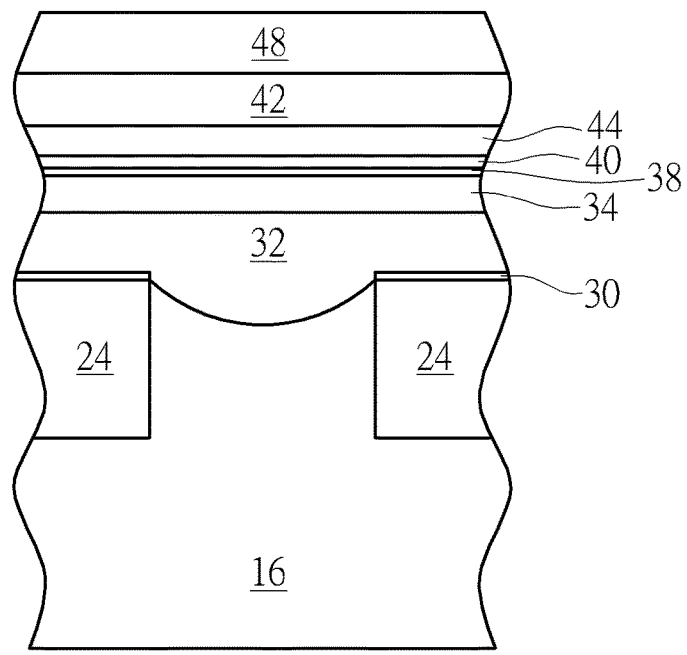

Next, as shown in FIG. 5, a conductive layer 42 and a cap layer 48 could be sequentially formed on the surface of the metal silicon nitride layer 34, in which the conductive layer 42 preferably includes tungsten and the cap layer 48 preferably includes silicon nitride. It should be noted that an optional thermal treatment process (such as an anneal process) could be conducted during the formation of the conductive layer 42 so that an additional metal silicide 44 could be formed between the second metal silicon nitride layer 40 and the conductive layer 42, in which the metal silicide 44 preferably includes tungsten silicide.

Figure 6:
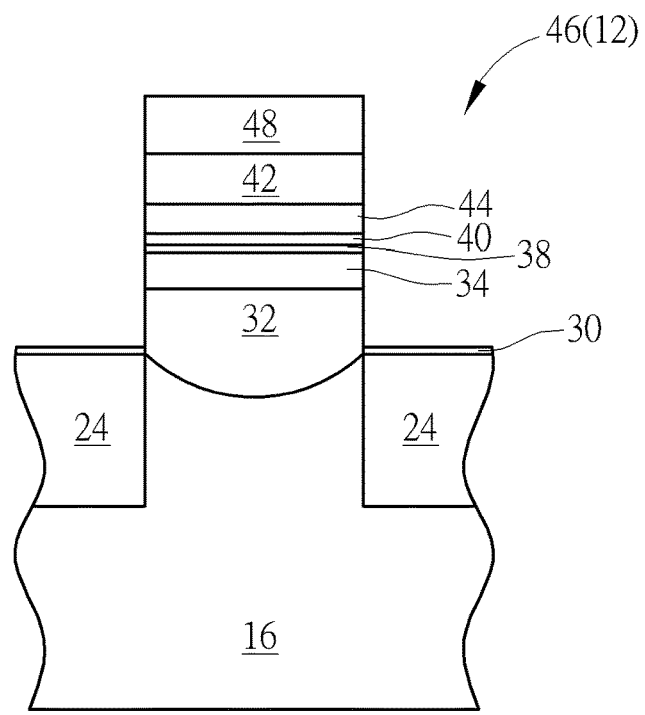

Next, as shown in FIG. 6, a patterning or photo-etching process could be conducted to pattern the cap layer 48, the conductive layer 42, the metal silicide 44, the second metal silicon nitride layer 40, the oxide layer 38, the first metal silicon nitride layer 34, and the silicon layer 32 to form a gate structures 46 on the substrate 16. Specifically, the gate structure 46 formed at this stage preferably serving as a bit line structure 12 for a DRAM device while part of the silicon layer 32 directly contacting the substrate 16 is serving as a bit line contact. Next, storage node contacts could be formed adjacent to two sides of the bit line structure 12 to electrically connect source/drain regions and capacitors formed in the later process. Since the fabrication of storage node contacts and capacitors is well known to those skilled in the art, the details of which are not explained herein for the sake of brevity.

Referring again to FIG. 6, FIG. 6 further illustrates a structural view of a semiconductor device according to an embodiment of the present invention. As shown in FIG. 6, the semiconductor device preferably includes a gate structure 46 disposed on the substrate 16, in which the gate structure 46 includes a silicon layer 32 disposed on the substrate 16, a first metal silicon nitride layer 34 disposed on the silicon layer 32, an oxide layer 38 disposed on the first metal silicon nitride layer 34, a second metal silicon nitride layer 40 disposed on the oxide layer 38, a conductive layer 42 disposed on the second metal silicon nitride layer 40, a metal silicide 44 disposed between the second metal silicon nitride layer 40 and the conductive layer 42, and a cap layer 48 disposed on the conductive layer 42.

In this embodiment, the silicon layer 32 preferably includes amorphous silicon, the first metal silicon nitride layer 34 and the second metal silicon nitride layer 40 preferably includes a same material such as TiSiN, the thickness of the first metal silicon nitride layer 34 is preferably greater than the thickness of the second metal silicon nitride layer 40, the metal silicide 44 preferably includes tungsten silicide, and the conductive layer 42 preferably includes tungsten.

Figure 7:
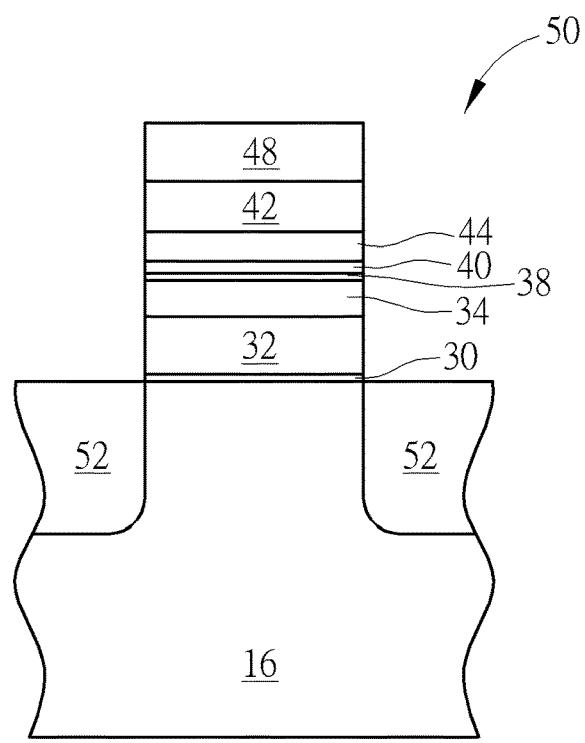
FIG. 7 illustrates a structural view of a gate structure formed on the periphery region according to an embodiment of the present invention.

Referring to FIG. 7, FIG. 7 illustrates a structural view of a semiconductor device according to an embodiment of the present invention. As shown in FIG. 7, it would also be desirable to form the bit line structure 12 shown in FIG. 6 on the memory region 20 and at the same time form another gate structure 50 on the substrate 16 on the periphery region, in which the gate structure 50 preferably includes a silicon layer 32 disposed on the substrate 16, a gate insulating layer 30 disposed between the silicon layer 32 and the substrate 16, a first metal silicon nitride layer 34 disposed on the silicon layer 32, an oxide layer 38 disposed on the first metal silicon nitride layer 34, a second metal silicon nitride layer 40 disposed on the oxide layer 38, a conductive layer 42 disposed on the second metal silicon nitride layer 40, a metal silicide 44 disposed between the second metal silicon nitride layer 40 and the conductive layer 42, and a cap layer 48 disposed on the conductive layer 42. In contrast to having STI 24 disposed adjacent to two sides of the gate structure 46 as shown in FIG. 6, a source/drain region 52 is disposed in the substrate 16 adjacent to two sides of the gate structure 50 on the periphery region, in which the source/drain region 52 could include n-type or p-type dopants depending on the type of transistor being fabricated.

Overall, the present invention preferably conducts an air break step or more specifically an oxygen plasma surface treatment process on the first metal silicon nitride layer composed of TiSiN or exposing the first metal silicon nitride layer in the air to form an oxide layer on the first metal silicon nitride layer during the fabrication of bit line structure. Next, a second metal silicon nitride layer preferably also made of TiSiN is formed on the surface of the oxide layer to create a structure sandwiching an oxide layer between two metal silicon nitride layers. Preferably, the presence of the oxide layer could be used to improve interfaces between metal silicon layers and adjacent layers, prevent silicon atoms from diffusing into the conductive layer made of tungsten, and also lower the overall thickness of the metal silicon nitride layer thereby reducing overall resistance of the device.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating semiconductor device, comprising:
    forming a silicon layer on a substrate;
    forming a first metal silicon nitride layer on the silicon layer;
    performing an oxygen treatment process to form an oxide layer on the first metal silicon nitride layer;
    forming a second metal silicon nitride layer on the oxide layer;
    forming a conductive layer on the second metal silicon nitride layer; and
    patterning the conductive layer, the second metal silicon nitride layer, the oxide layer, the first metal silicon nitride layer, and the silicon layer to form a gate structure.

2. The method of claim 1, wherein the silicon layer comprises amorphous silicon.

3. The method of claim 1, wherein the first metal silicon nitride layer and the second metal silicon nitride layer comprise a same material.

4. The method of claim 1, wherein the first metal silicon nitride layer and the second metal silicon nitride layer comprise titanium silicon nitride (TiSiN).

5. The method of claim 1, wherein a thickness of the first metal silicon nitride layer is greater than a thickness of the second metal silicon nitride layer.

6. The method of claim 1, wherein the conductive layer comprises tungsten (W).

7. The method of claim 1, further comprising forming a metal silicide between the second metal silicon nitride layer and the conductive layer.

8. The method of claim 7, wherein the metal silicide comprises tungsten silicide.

9. The method of claim 1, wherein the gate structure comprises a gate insulating layer on the substrate.

10. The method of claim 1, wherein the oxygen treatment process comprises an oxygen plasma surface treatment process or exposing the first metal silicon nitride layer in the air.

11. A semiconductor device, comprising:
    a gate structure on a substrate, wherein the gate structure comprises:
        a silicon layer on the substrate;
        a first metal silicon nitride layer on the silicon layer;
        an oxide layer on the first metal silicon nitride layer;
        a second metal silicon nitride layer on the oxide layer; and
        a conductive layer on the second metal silicon nitride layer.

12. The semiconductor device of claim 11 wherein the silicon layer comprises amorphous silicon.

13. The semiconductor device of claim 11, wherein the first metal silicon nitride layer and the second metal silicon nitride layer comprise same material.

14. The semiconductor device of claim 11, wherein the first metal silicon nitride layer and the second metal silicon nitride layer comprise titanium silicon nitride (TiSiN).

15. The semiconductor device of claim 11, wherein a thickness of the first metal silicon nitride layer is greater than a thickness of the second metal silicon nitride layer.

16. The semiconductor device of claim 11, wherein the conductive layer comprises tungsten (W).

17. The semiconductor device of claim 11, further comprising a metal silicide between the second metal silicon nitride layer and the conductive layer.

18. The semiconductor device of claim 17, wherein the metal silicide comprises tungsten silicide.

19. The semiconductor device of claim 11, wherein the gate structure comprises a gate insulating layer on the substrate.

* * * * *